United States Patent
Nanson et al.

(10) Patent No.: US 8,983,802 B2
(45) Date of Patent: Mar. 17, 2015

(54) NOTCH RE-BLEND IN AN OBJECT MODEL

(75) Inventors: Peter Philip Lonsdale Nanson, Cambridge (GB); Richard Charles Collins, Cambridge (GB); Alexandra Jane Smith, Cambridge (GB)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 237 days.

(21) Appl. No.: 13/091,203

(22) Filed: Apr. 21, 2011

(65) Prior Publication Data
US 2012/0271595 A1    Oct. 25, 2012

(51) Int. Cl.
*G06F 17/50*    (2006.01)

(52) U.S. Cl.
CPC ..... *G06F 17/5086* (2013.01); *G06T 2219/2021* (2013.01); *G06F 17/50* (2013.01)
USPC ........................................... 703/1

(58) Field of Classification Search
CPC ............... G06F 17/5086; G06F 17/50; G06T 2219/2021
USPC ........................................... 703/1
See application file for complete search history.

(56) References Cited

U.S. PATENT DOCUMENTS

| | | | |
|---|---|---|---|
| 6,133,922 A * | 10/2000 | Opitz ............................. | 345/420 |
| 6,720,963 B2 | 4/2004 | Yoshida et al. | |
| 6,760,038 B2 | 7/2004 | Venkataraman et al. | |
| 6,898,560 B1 | 5/2005 | Das | |
| 7,236,167 B2 | 6/2007 | Rockwood et al. | |
| 7,236,168 B2 * | 6/2007 | Venkataraman et al. ..... | 345/420 |
| 7,408,560 B2 | 8/2008 | Staples et al. | |
| 7,830,377 B1 * | 11/2010 | Desimone et al. ............ | 345/420 |
| 8,326,583 B2 * | 12/2012 | Yu et al. ........................... | 703/1 |
| 2004/0257362 A1 | 12/2004 | Venkataraman et al. | |
| 2010/0305906 A1 | 12/2010 | Yu et al. | |
| 2012/0007864 A1 | 1/2012 | Lonsdale Nanson et al. | |

OTHER PUBLICATIONS

Zhu, H., and C. H. Meng. "B-Rep model simplification by automatic fillet/round suppressing for efficient automatic feature recognition." Computer-Aided Design 34.2 (2002): 109-123.*

Cui, Xiu-fen, Shu-ming Gao, and Guang-ping Zhou. "An efficient algorithm for recognizing and suppressing blend features." Computer Integrated Manufacturing Systems-Beijing- 10.1 (2004): 77-82.*

PCT International Search Report mailed Jan. 17, 2012 corresponding to PCT International Application No. PCT/US2011/043050 filed Jul. 6, 2011 (21 pages).

Wolfgang Sohrt et al., Interaction with "Constraints in 3D Modeling", Jun. 5, 1991, Dept of Computer Science, University of Utah, (pp. 387-396).

(Continued)

*Primary Examiner* — Aniss Chad

(57) ABSTRACT

A method for a CAD system, a CAD system, and instructions for a CAD system. A method includes receiving an object model including a plurality of features. The method includes creating a blend as part of the object model, using at least one of the features, and removing the used features. The method includes creating a construction body corresponding to the object model, and storing the removed features in the construction body. The method includes performing a CAD operation on the object model using the features stored in the construction body.

18 Claims, 3 Drawing Sheets

(56) References Cited

OTHER PUBLICATIONS

Ivan E. Sutherland, "Sketchpad: A Man-Machine Graphical Communication System", XP009032646, Massachusetts Institute of Technology (pp. 329-346); 1963.
Remove Face from DocR22, 1999-2012 Spatial Corp., http://doc.spatial.com/index.php/Remove_Face, 5 pages.
PCT International Search Report mailed Jul. 27, 2012 corresponding to PCT International Application No. PCT/US2012/033012 (5 pages).
Written Opinion of the International Searching Authority dated Jul. 27, 2012 in connection with International Application No. PCT/US2012/033012 (7 pages).
Lee et al., "A Small Feature Suppression/Unsuppression System for Preparing B-Rep Models for Analysis", Proceedings ACM Symposium on Solid and Physical Modeling, ACM 2005, 12 pages.
Non-Final Office Action issued Oct. 22, 2013 in U.S. Appl. No. 12/831,584, 21 Pages.

\* cited by examiner

NOTCH RE-BLEND IN AN OBJECT MODEL

TECHNICAL FIELD

The present disclosure is directed, in general, to computer-aided design, visualization, and manufacturing systems, product lifecycle management ("PLM") systems, and similar systems, referred to herein individually and collectively as "CAD systems."

BACKGROUND OF THE DISCLOSURE

Many object models in CAD systems have limitations on how model data is managed. Improved systems are desirable.

SUMMARY OF THE DISCLOSURE

Various embodiments include methods for CAD systems, CAD systems, and instructions for CAD systems.

In some embodiments, a method includes receiving an object model including a plurality of features. The method includes creating a blend as part of the object model, using at least one of the features, and removing the used features. The method includes creating a construction body associated with the object model, and storing the removed features in the construction body. The method includes performing a CAD operation on the object model or construction body using the features stored in the construction body.

In some embodiments, a method includes receiving an object model in a CAD system, the object model including a blend and not including underlying features that define the blend and from which the blend can be re-created. Without the underlying features, the object model contains insufficient geometry to define the geometry of these blends. The method includes determining the underlying features. The method includes creating a construction body corresponding to the object model, and storing the underlying features in the construction body. The method includes performing a CAD operation on the object model using the features stored in the construction body.

In some embodiments, a method includes receiving an object model in a CAD system, the object model including a blend and not including underlying features that define the blend and from which the blend can be re-created. Without the underlying features, the object model contains insufficient geometry to define the geometry of these blends. The method includes determining the underlying features. The method includes creating a construction body corresponding to the object model, and storing the underlying features in the construction body. The method includes performing a CAD operation on the features stored in the construction body and performing a second CAD operation on the object model using the features stored in the construction body.

In some embodiments, a method includes performing a CAD operation on an object model including a plurality of features. The method includes identifying that a subset of the features represent blends and that the CAD operation has removed the geometry required to define the geometry of these blends. The method includes creating a construction body associated with the object model, and storing the removed features or geometry in the construction body. The method includes performing a CAD operation on the object model using the features stored in the construction body.

The foregoing has outlined rather broadly the aspects and technical advantages of the present disclosure so that those skilled in the art may better understand the detailed description that follows. Additional aspects and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
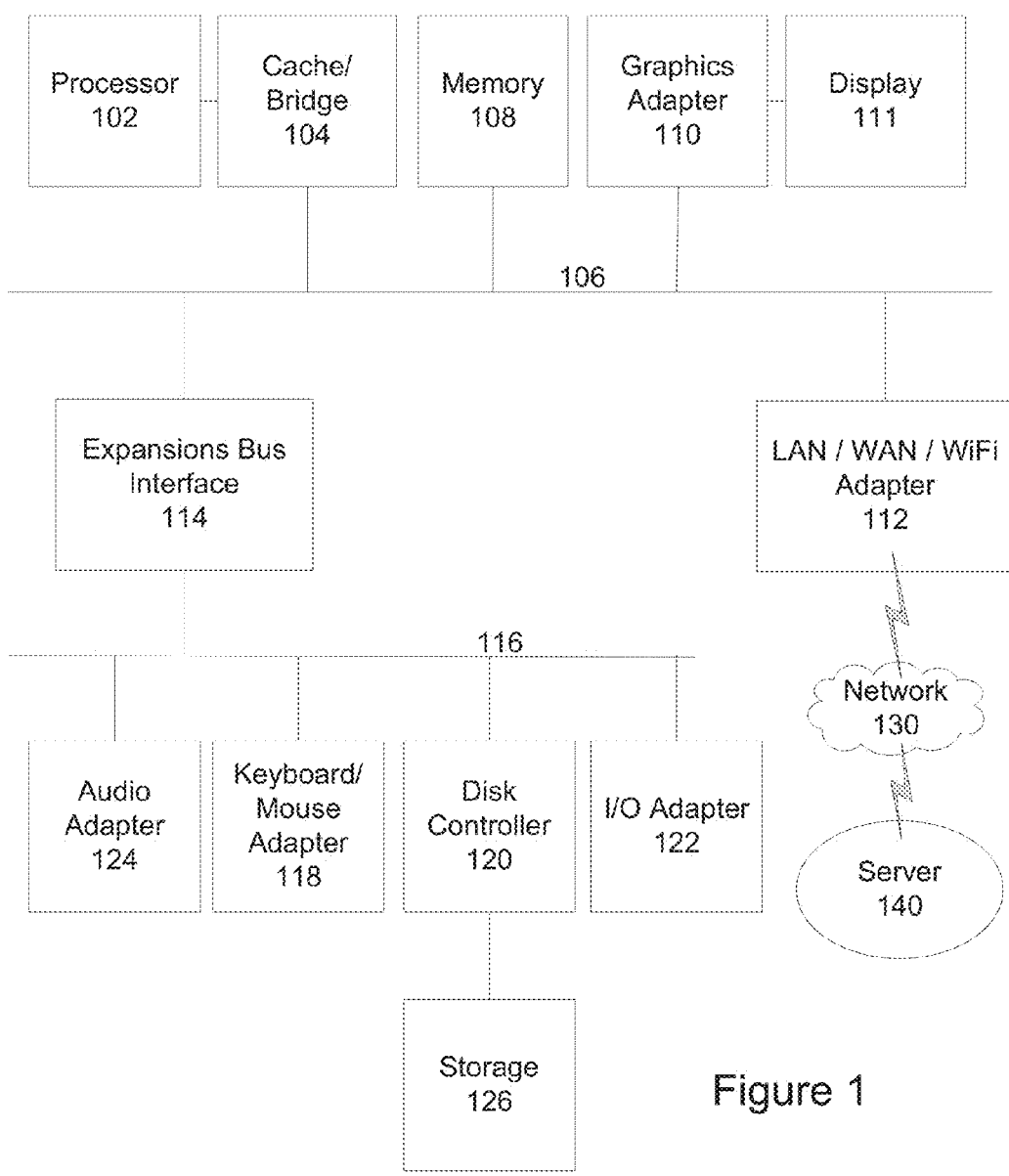
FIG. 1 depicts a block diagram of a data processing system in which an embodiment can be implemented.
Figure 2A:
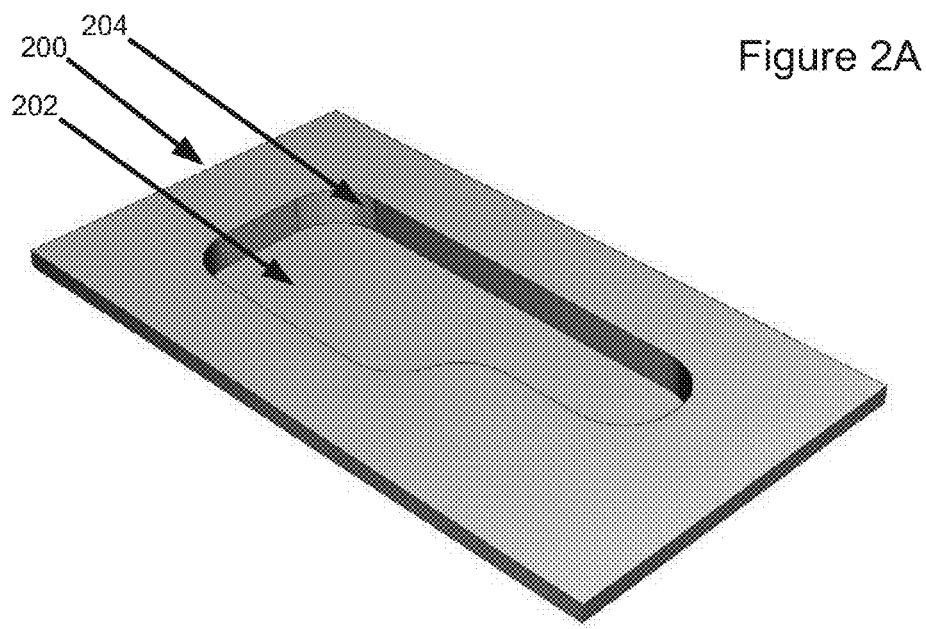
FIG. 2A illustrates an exemplary object model having a shallow pocket with vertical walls.
Figure 2B:
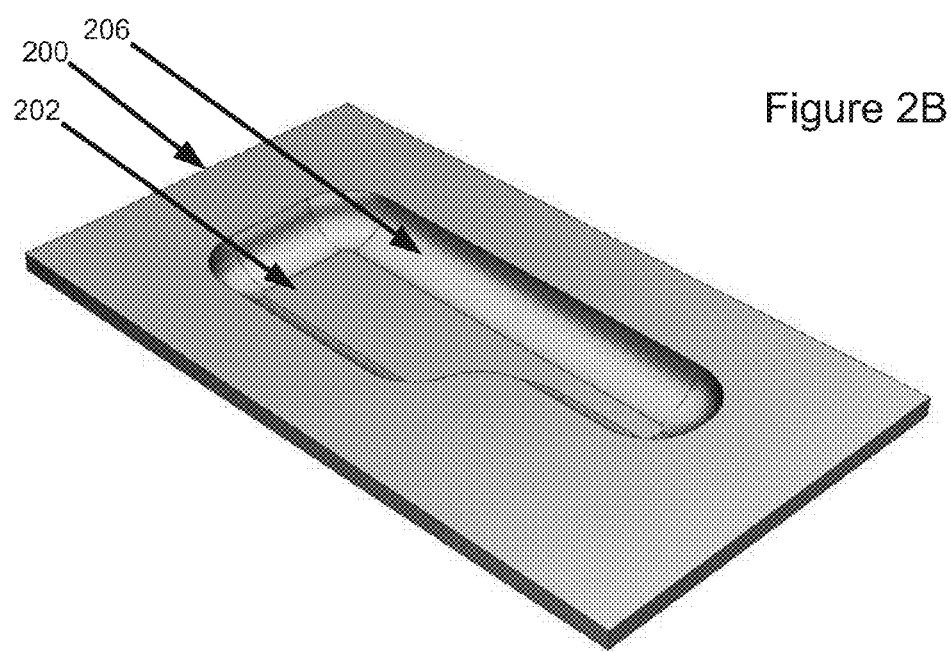
FIG. 2B illustrates the object model after blends have been added to the pocket.
Figure 3:
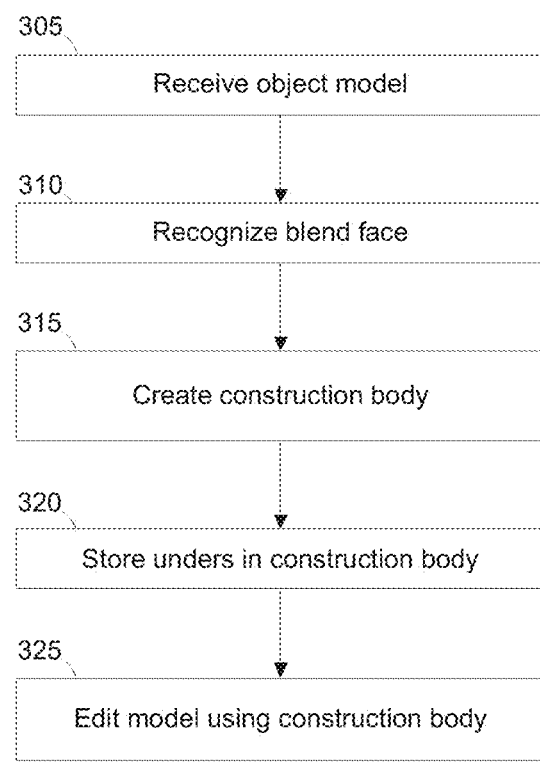
FIG. 3 depicts a flowchart of a process in accordance with disclosed embodiments.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Boundary Representation, or B-Rep, is the de facto industry standard for 3D geometry representation in modern CAD packages. A B-Rep allows the representation of free-form curves and surfaces, usually in the form of NURBS (Non-Uniform Rational B-Spline), and can be used to accurately represent the 3D geometry design information.

In linear-history modeling, an object model in a CAD system is constructed with a practice conducive to dimensioning a nominal state of the model. Form features are constructed early in history, and typically include precise edges bounding each face. A pad or pocket is constructed from a profile with sharp corners at nominal dimensions. Detail features such as blend surfaces (blends) are added later and modify the geometry of the model. Blends replace the nominal sharp edges. The nature of history maintains order so that nominal dimensions continue to drive the model prior to the blends, and can be referenced in later operations.

Blends in a B-Rep model are defined as parametric features based on other geometry and topology in the model. The "other geometry and topology" is referred to herein as "underlying data" or "unders". The unders for a blend typically comprises face and edge entities with topological data on connectivity between them. A blend is also known in the industry as a "fillet" or a "round", and as used herein can also include chamfers. Blends can have various definitions: rolling-ball cross-section, disc (swept) cross-section, or others, and be circular, conic, curvature-continuous shape, or others.

In many common cases, the creation of a blend consumes some or all of the blend's unders in such a way that the unders are no longer part of the B-Rep definition of the modified B-Rep model. This can make other, later processes difficult since those processes may most effectively be driven or constrained to the underlying data.

Disclosed embodiments, described in more detail below, include systems and methods for maintaining or recreating the underlying data for a blend for use in other processes.

FIG. 1 depicts a block diagram of a data processing system in which an embodiment can be implemented, for example as a CAD system particularly configured by software or otherwise to perform the processes as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

FIG. 2A illustrates an exemplary object model 200 with a shallow pocket 202 with vertical walls 204. FIG. 2B illustrates the object model 200 after blends 206 have been added to the pocket 202. Note that in FIG. 2B, the vertical 204 walls are entirely replaced by blends 206 on the bottom edge loop of the pocket. The blends 206 have a radius greater than pocket depth.

Data concerning the deleted unders cannot be retained in the B-Rep model for object model 200 because of the rigorous rules that govern the data structure of a B-Rep model. In various embodiments, the B-Rep model is the main body and is the object that the blend is applied to and whose features get removed.

In conventional systems, once features are removed from a B-Rep model, there is no way of recovering them later or keeping them synchronized with subsequent changes to the main body. Disclosed embodiments can preserve, store, and/or recreate those under features in a construction body as described herein. In some embodiments, the construction body itself can be a valid B-rep model, but a different one from the main body in the sense that the Boundary-Representation definition of the main body does not include the construction body and vice-versa.

The main and construction bodies may be connected by various data structures and linkages (including, for example, the attribute mechanism described in U.S. patent application Ser. No. 12/831,584, filed Jul. 7, 2010, hereby incorporated by reference). These include information such as coincidence and laminar edge relations, that enable intelligent behavior of the unders during subsequent CAD operations.

It is also common that the unders of a blend may be deleted at a later stage by operations that do not directly reference the blend. For example, where a deep pocket has a blend around the edge of the bottom face. If the bottom ace is moved to reduce the depth of the pocket to less than the radius of the blend, the side walls of the pocket, which are unders of the blend, are deleted.

Various disclosed embodiments include processes for identifying the unders of a blend at the time the blend is created, and storing the unders in an alternative representation alongside the B-Rep model so that the unders may be accessed later to be re-introduced accurately and efficiently should the blend be modified or deleted. This process ensures that blend creation, modification and deletion operations are fully reversible in order to give predictable and intuitive results.

Similarly, various disclosed embodiments also include processes for recreating the unders of an existing blend, and storing the unders in an alternative representation alongside the B-Rep model so that the unders may be accessed later to be re-introduced accurately and efficiently should the blend be modified or deleted. This process also helps ensure that blend creation, modification and deletion operations are fully reversible in order to give predictable and intuitive results, even when the unders of the blend were not originally present. This can be particularly useful in cases where the geometry is originally received or imported with the blend already present without its unders.

Various embodiments also include processes to display the stored unders during interactive modification of the blend to help the end-user visualize the dynamics of the operation. For example, the deleted unders of a blend can be extracted from the alternative representation and displayed with handles so the end-user can manipulate them in order to modify the blend.

Various embodiments also include processes to modify a blend by manipulating its unders even when they no longer form part of the B-Rep model. For example, the deleted unders of a blend may be extracted from the alternative representation and modified. The blend can then be re-created based on the modified unders to give a modified blend.

These specific technical advantages can be achieved, in various embodiments, using a "construction body" as the alternative representation to store the unders and any other non-B-Rep information regarding the body geometry and topology, particularly that information that cannot be stored within the structures of a standard B-Rep model description. In various embodiments, the construction bodies can be implemented as described in U.S. patent application Ser. No. 12/831,584, incorporated above.

The construction body can store information on the relation between the unders and the main model, such as by specifying coincidence relations. The construction body can store information on the relation between laminar edges and the model, such as by specifying laminar edge relations as described below. The construction body can store information on the relation between a notch blend and its unders.

In some cases, the system can also calculate the new positions of the edges when the model changed, change multiple bodies simultaneously, and reblend or delete notch blends or other features, in either case potentially reintroducing the unders, or modifications of the unders such as transformations or offsets, into the main model.

As used herein, notch blends are blends where one (or both) of the unders have been removed from the B-Rep body, or at the very least is no longer adjacent.

The system can identify notch blends and other blends, and can also reconstruct the missing unders. The system stores this information and makes it accessible to local and remote processes as needed, and passes suitable reblend information into the system or other processes as needed for modeling operations.

The system can manage the marking, enquiry, maintenance and reblending of notch blends. The missing faces can be stored as described herein. Notch blends and other related features act as persistent "user marked blends" whose unders are stored in a separate construction body.

The system associates "construction bodies" with a body, and references entities in the construction body from entities in the main body. To do so, the system defines an association (called a "construction reference") of entities on a body and entities in one or more separate "construction" bodies. In some embodiments, the entities can include regions, shells, faces, loops, edges, and vertices. A body can have any number of "construction" bodies. Preferably, construction bodies do not have construction bodies of their own, and a construction body only belongs to one B-Rep body.

The association between construction bodies and the main body, can be retained through a process of transmit and receive.

In various embodiments, the system can define a "coincidence relation" between at least two faces. These faces should be in the same body or associated construction bodies, and they should have coincident surfaces with parallel face normals. The coincidence relation can be automatically created; for example, if the system reintroduces a face from a missing under, it can automatically create a coincidence relation between the new under and the specified under, usually in a construction body.

If the system defines a coincidence relation on faces which already have a coincidence relation, then the relevant coincidence relations can be merged into one relation. The system can determine, for example at a user request or the request of another process, which faces are in a coincidence relation to a given face. The system can remove the coincidence relation(s) from a specified set of faces.

In some embodiments, the system can also maintain similar relationships with regard to coincident-but-opposed faces.

As described above, the system can also maintain laminar edge relations that describe the relation between laminar edges and the model. The system can use these to control the arbitrary laminar edges of construction bodies which support notch blends so that the construction bodies move appropriately with edits/transformations of the main body. A laminar edge is an edge with only one coedge, such as at the boundary of an open sheet body.

In some embodiments, the edges are defined to be the intersection of the construction face and an offset of the opposite under face. The laminar edge relation (also referred to as an "edge offset relation") can link each edge with its defining other face along with an offset distance, so that a move of that face would result in a move of the edge. This provides an advantage in that it allows laminar edges to be linked to faces or surfaces that define their geometry e.g. for cylindrical cut-outs.

The system can define an edge offset relation between an edge and an entity at a given offset. The edge and the entity should be in the same body or associated construction bodies, and they should not already be in a valid edge offset relation. In most cases, faces are used as the reference entities, and an edge offset relation only contains one edge. An edge offset relation may contain more than one entity. If the edge is split then new edge offset relations will be created for the derived edges; if an entity is split then the derived entities will be added to the relation.

The system can determine, for example at a user request or the request of another process, the edge offset relation for a given edge and the edge offset relations which contain a given entity.

Various embodiments are able to apply a re-blend operation based on unders or other features found in the construction body but no longer in the main body. In general, in order to reapply a face as a blend, the face must to either be identifiable as a blend or have the underlying faces supplied by the user or maintained by the system. In conventional systems, any underlying faces supplied had to belong to the same body as the face being reapplied as a blend. This restriction meant that if an operation had been performed which resulted in one or both of underlying faces of the blend vanishing that it was not possible to reapply this face as a blend, and as a result some operations could not be "undone."

According to various embodiments, the blend operation can be reapplied, or undone, when one or more of the underlying faces for the face being reapplied as a blend isn't present in the main body but is maintained in the construction body. This is useful in cases where one of the underlying faces has vanished from the body.

This approach can be used, for example, when a missing under is used for a vertex blend. In this case, the missing under is maintained in the construction body as an edge blend.

FIG. 3 depicts a flowchart of a process in accordance with disclosed embodiments.

The system receives a three-dimensional object model (step 305). The system can be implemented, for example, as a data processing system 100, and can be a CAD system, a PLM system, or other system that allows users to manipulated three-dimensional object models. The object model can be a binary representation model that may or may not be displayed to a user in a 3D representation. "Receiving," as used herein, can include loading from storage, receiving from another system or process; including over a network, or receiving or interactively building via an interaction with a user. The object model includes at least one edge joining two faces.

The system creates a blend as part of the object model, using one or more features of the object model (step 310). The features used, in this example, are removed from the B-Rep object model. Creating the blend can include converting the edge to a blend. This can be done in response to a user input or a request from another system or process. In some cases, the blend has a radius that is greater than the length of one or both faces in a direction normal to the edge. The conversion can remove, for example, the edge and one or both of the faces from the object model.

The system creates a construction body corresponding to the object model (step 315). As part of this step, the system can define a construction reference between the object model and any entities stored in the construction body. As part of this step, the system can create references between the object model and the construction body.

The system stores the removed features, such as the edge and one or both of the faces, in the construction body (step 320). These removed features include the unders of the blend. The system can also store any other unders for the blend or other features of the object model, and any other non-B-Rep information regarding the geometry and topology of the B-Rep object model. The system can also store any coincident relations, laminar edge relations, and information regarding notch blends in the construction body. Where necessary, the system can construct any missing unders for features of the object model. Storing the removed features can include contracting the construction body and storing it as associated with the object model, including as an attribute of the object model.

The system performs a CAD operation on the object model using the features stored in the construction body (step 325). This can include, for example, performing a re-blend operation, performing a dimensioning operation, manipulating a notch blend, or performing other operations using the features stored in the construction body. As part of this step, the system can also calculate the new positions of the edges when the model changed, change multiple bodies simultaneously, and reblend or delete notch blends or other features.

Of course, those of skill in the art will recognize that, unless specifically indicated or required by the sequence of operations, certain steps in the processes described above may be omitted, performed concurrently, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method performed by a CAD data processing system, comprising:
   receiving an object model in a CAD system, the object model including a plurality of features;
   creating a blend as part of the object model, using at least one of the features, and removing the used features;
   creating a construction body corresponding to the object model;
   storing the removed features in the construction body; wherein the removed features include unders for the blend;
   modifying at least one of the unders for the blend that is stored in the construction body;
   creating a modified blend as part of the object model using at least one of the modified unders without recreating, in the object model, the unders for the blend; and
   performing a CAD operation on the object model using the features stored in the construction body.

2. The method of claim 1, wherein creating the construction body includes creating references between the object model and the construction body, wherein the references include an edge offset relation.

3. The method of claim 1, wherein the object model is a boundary representation model.

4. The method of claim 1, wherein the CAD operation includes a re-blend operation using the features stored in the construction body.

5. A CAD system, comprising a processor and accessible memory, the CAD system particularly configured to perform the steps of:
   receiving an object model including a plurality of features;
   creating a blend as part of the object model, using at least one of the features, and removing the used features;
   creating a construction body corresponding to the object model;
   storing the removed features in the construction body; wherein the removed features include unders for the blend;
   modifying at least one of the unders for the bend that is stored in the construction body;
   creating a modified blend as part of the object model using at least one of the modified unders without recreating, in the object model, the unders for the blend; and
   performing a CAD operation on the object model using the features stored in the construction body.

6. The CAD system of claim 5, wherein creating the construction body includes creating references between the object model and the construction body, wherein the references include an edge offset relation.

7. The CAD system of claim 5, wherein the object model is a boundary representation model.

8. The CAD system of claim 5, wherein the CAD operation includes a re-blend operation using the features stored in the construction body.

9. A non-transitory computer-readable medium encoded with computer-executable instructions that, when executed, cause a CAD system to perform the steps of:
   receiving an object model including a plurality of features;
   creating a blend as part of the object model, using at least one of the features, and removing the used features;
   creating a construction body corresponding to the object model;
   storing the removed features in the construction body; wherein the removed features include unders for the blend;
   modifying at least one of the unders for the blend that is stored in the construction body;
   creating a modified blend as part of the object model using at least one of the modified unders without recreating, in the object model, the unders for the blend; and
   performing a CAD operation on the object model using the features stored in the construction body.

10. The computer-readable medium of claim 9, wherein creating the construction body includes creating references between the object model and the construction body, wherein the references include an edge offset relation.

11. The computer-readable medium of claim 9, wherein the object model is a boundary representation model.

12. The computer-readable medium of claim 9, wherein the CAD operation includes a re-blend operation using the features stored in the construction body.

13. A method performed by a CAD data processing system, comprising:
   receiving an object model in a CAD system, the object model including a blend and not including underlying features that define the blend and from which the blend can be re-created;
   determining the underlying features;
   creating a construction body corresponding to the object model;
   storing the underlying features in the construction body;
   modifying the underlying features;
   creating a modified blend as part of the object model based on the modified underlying features without recreating, in the object model, the underlying features; and
   performing a CAD operation on the object model using the features stored in the construction body.

14. The method of claim 13, wherein the CAD operation includes a re-blend operation using the features stored in the construction body.

15. A method performed by a CAD data processing system, comprising:
   receiving an object model in a CAD system, the object model including a plurality of features;
   creating a blend as part of the object model, using at east one of the features, and removing the used features;
   creating a construction body corresponding to the object model;
   storing the removed features in the construction body, wherein the removed features include unders for the blend;
   modifying at least one of the unders for the blend that is stored in the construction body;
   creating a modified blend as part of the object model using at least one of the modified unders without recreating, in the object model, the unders for the blend;
   performing a CAD operation on the features stored in the construction body; and
   performing a second CAD operation on the object model using the features stored in the construction body.

16. The method claim 15, wherein the second CAD operation includes a re-blend operation.

17. A method performed by a CAD data processing system, comprising:
   performing a CAD operation on an object model, the object model including a plurality of features;
   identifying that a subset of the features represent blends and that the CAD operation has removed geometry required to define the blends;
   creating a construction body corresponding to the object model;
   storing the removed features in the construction body;
   storing the removed features in the construction body, wherein the removed features include unders for the blends;
   modifying unders that are stored in the construction body for at least one of the blends;
   creating a modified blend as part of the object model using the modified unders without recreating, in the object model, the unders for the blend; and
   performing a CAD operation on the object model using the features stored in the construction body.

18. The method of claim 17, wherein the CAD operation includes a re-blend operation.

* * * * *